US006727556B2

(12) United States Patent
Shiiki et al.

(10) Patent No.: US 6,727,556 B2
(45) Date of Patent: Apr. 27, 2004

(54) SEMICONDUCTOR DEVICE AND A METHOD OF MANUFACTURING THEREOF

(75) Inventors: Mika Shiiki, Chiba (JP); Minoru Sudou, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/915,446

(22) Filed: Jul. 26, 2001

(65) Prior Publication Data

US 2002/0020879 A1 Feb. 21, 2002

(30) Foreign Application Priority Data

Aug. 9, 2000 (JP) ........................................ 2000-241337
Oct. 30, 2000 (JP) ........................................ 2000-331082

(51) Int. Cl.$^7$ ............................................. H01L 23/62
(52) U.S. Cl. ...................... 257/358; 257/359; 257/360; 257/363; 257/380; 257/536; 257/537; 257/538
(58) Field of Search ................... 257/350, 358–360, 257/363, 379–380, 516, 528, 536, 537–538, 577, 904

(56) References Cited

U.S. PATENT DOCUMENTS 5,541,442 A * 7/1996 Keil et al. .................. 257/531
5,710,070 A * 1/1998 Chan ............................ 347/59
6,359,339 B1 * 3/2002 Gregor et al. .............. 257/757
6,376,896 B1 * 4/2002 Shiiki et al. ................ 257/536

* cited by examiner

Primary Examiner—Thien F Tran
(74) Attorney, Agent, or Firm—Adams & Wilks

(57) ABSTRACT

A semiconductor device has a semiconductor element formed on a semiconductor substrate and a first insulating film having contact holes. The semiconductor element has a gate electrode, a source region and a drain region. The semiconductor element also has metal wirings each for connecting a respective one of the contact holes to the gate electrode, the source region and the drain region of the semiconductor element. A second insulating film is formed on the first insulating film and the metal wirings. The second insulating film has a chemical-mechanical polished portion defining a flattened upper surface of the second insulating film. Resistors are formed on and are disposed directly in contact with the flattened upper surface of the second insulating film and are connected in series to form a bleeder resistor circuit or a ladder circuit.

24 Claims, 12 Drawing Sheets

FIG. 2

| MATERIAL OF FILM | CHARACTERISTICS |
|---|---|
| Ni-Cr | GENERALLY USED AS A MATERIAL OF A THIN FILM TRANSISTOR. HAS GOOD TEMPERATURE CHARACTERISTIC. |
| CrSiO | HAS RELATIVELY HIGH RESISTIVITY OF SILICIDE FILMS (METAL COMPOUND OF A METAL ELEMENT AND Si). HOWEVER, WITH CrSi, SINCE THERE IS NO HEAT STABILITY, HEAT STABILITY IS MAINTAINED BY ADDING O(OXYGEN) OR N(NITROGEN). HAS GOOD TEMPERATURE CHARACTERISTIC. |
| CrSiN | |
| CrSiON | |
| β-FeSi | HAS RELATIVELY HIGH RESISTIVITY AMONG SILICIDE FILMS. FURTHER, THERE ARE PLENTY OF RESERVES AND HAS LOW LOAD TO THE ENVIRONMENT SINCE IT IS FORMED OF HARMLESS Fe AND Si. HAS GOOD TEMPERATURE CHARACTERISTIC. |
| AMORPHOUS SILICON | MAY EASILY REALIZE RESISTIVITY OF SEVERAL $\Omega$ TO SEVERAL TENS OF K$\Omega$ / □. FURTHER IS EASILY PROCESSED. |
| POLYCRYSTALLINE SILICON | MAY EASILY REALIZE RESISTIVITY OF SEVERAL $\Omega$ TO SEVERAL TENS OF K$\Omega$ / □. FURTHER IS EASILY FORMED AND PROCESSED. |
| WSi | HAS GOOD TEMPERATURE CHARACTERISTIC, AND IS EASILY FORMED, PROCESSED SINCE ARE THE METALLIC FILMS GENERALLY USED |
| TiN | |
| W | |
| TAN | HAS GOOD TEMPERATURE CHARACTERISTIC |
| Mo-Si | |
| Ti/TiN | CAN RELIEVE STRESS. HAS GOOD TEMPERATURE CHARACTERISTIC. IS EASILY FORMED, PROCESSED SINCE ARE THE METALLIC FILMS GENERALLY USED |
| Ti/WN | |

SEMICONDUCTOR DEVICE AND A METHOD OF MANUFACTURING THEREOF

BACKGROUND OF THE INVENTION

1. Field of the Invention

The present invention relates to a semiconductor device and a method of manufacturing thereof, and particularly to a semiconductor device having a semiconductor element and a resistor and to a method of manufacture thereof.

2. Description of the Related Art

Recently, the miniaturization and integration of the semiconductor device is progressing, and various attempts are made to form many semiconductor elements on a small surface of a semiconductor chip. Further, the semiconductor device formed with the semiconductor elements may be provided with a ladder circuit which splits a voltage.

Further, forming the ladder circuit on a small surface is a very important aspect in miniaturizing and integrating the semiconductor chip.

Conventionally, in order to miniaturize the ladder circuit, for example, as stated in Japanese Patent Application Laid-open No. Hei 9-51072, miniaturization and integration of the ladder circuit is attempted by forming an insulating film on a first resistor formed in a field region, and forming a second resistor on the insulating film to form a resistor with a two layer structure. Shown in FIG. 16 is a two layer structure where a first layer resist 77 and a second layer resist 66 are formed in a field region of a semiconductor substrate 75 in the thickness direction of the semiconductor substrate 75 through an interlayer insulating film 78.

However, when the two layer structure resistor is used, there is a problem in that the manufacturing steps are complicated and the manufacturing cost increases, and also it becomes difficult to have a specific accuracy equal to or more than that of the ladder circuit formed with the resistor which is formed above the conventional field region.

Further, conventionally the resistor was formed on only the field region, and the top of the active region was not used at all for miniaturization and integration of the semiconductor device regarding the arrangement of the resistor. Therefore, when forming the resistor on the semiconductor device, an area added with an area formed with a semiconductor element and an area formed with a resistor is necessary on the semiconductor substrate. Accordingly, if a resistor is formed on also the active region, the area of the whole semiconductor device may be made smaller. Thus, miniaturization and integration of the semiconductor chip may be further progressed. Further, since the area of the region where the resistor may be formed becomes larger, it becomes possible to use a substance with relatively small resistance and also to avoid a two layer structure of a resistor. Further, by leveling the insulating film below the resistor by CMP or the like, the conventional specific accuracy may be easily obtained. Note that, an active region refers to a region on the semiconductor substrate where a transistor and the like are formed.

Incidentally, when a resistor is formed on the active region, a special device is necessary in order to contact the resistor appropriately.

SUMMARY OF THE INVENTION

A first object of the present invention is to provide a semiconductor device, for example, a bleeder circuit, which is miniaturized and integrated. Further, the object is to provide a semiconductor device which uses such a bleeder resistance circuit with high accuracy, low cost and a small temperature coefficient, for example, a semiconductor device such as a voltage detector or a voltage regulator, with a small area.

Further, a second object of the present invention is to provide method of manufacturing a semiconductor device that is miniaturized and integrated, including a method of forming a contact to a resistor formed on the semiconductor device.

According to the present invention, there is provided a semiconductor device formed with a resistor on, for example, an active region formed with a semiconductor element such as a field effect transistor, of a semiconductor substrate through, for example, an insulating film leveled by CMP or the like. Thus, the first object is achieved.

Further, according to the present invention, there is provided a semiconductor device further provided with an insulating film such as a TEOS (tetraethoxy silane) $SiO_2$ film on a semiconductor device provided with a resistor on the active region, formed with electrodes on the resistor through contact holes formed in the insulating film. Thus, the first object is achieved.

Further, in the present invention, by having a resistor formed on the active region through the insulating film with a leveled top surface as a structural component of a ladder circuit, the first object is achieved.

Further, in the present invention, on the insulating film which has a leveled surface and is formed on the active region, the resistor is formed from a substance selected from the group consisting of a mixture of Ni and Cr, CrSiO, CrSiN, CrSiON, â-FeSi, amorphous silicon, polycrystalline silicon, WSi, TiN, W, TaN, and a mixture of Mo and Si, or a two layer formed of Ti and TiN, or Ti and WN, to obtain a satisfactory resistor, thereby achieving the first object.

Further, in the present invention, the resistor formed on the insulating film which has a leveled surface and is formed on the active region, is formed with a film thickness range of 50 to 4000 Å, preferably 100 to 1000 Å, and more preferably 200 to 700 Å to form a resistor with higher specific accuracy, thereby achieving the first object.

Further, in the present invention, a resistivity of the resistor formed on the insulating film which has a leveled surface and is formed on the active region, is in a range of 1 to 1 M $\Omega/\square$, and preferably 1 to 50 k $\Omega/\square$ so that the resistor with a high specific accuracy may be obtained, thereby achieving the first object.

Further, in the present invention, there is provided a method of manufacturing a semiconductor device, including the steps of forming a semiconductor element on a semiconductor substrate, then forming an insulating film on the semiconductor element, leveling the surface of the insulating film by, for example, CMP (chemical mechanical polishing) with the vertical interval within 20%, preferably within 10% of the film thickness of the interlayer film, forming the film of the resistor on the top surface of the leveled insulating film, and patterning the resistor on the active region from the film of the resistor, thereby achieving the second object. With CMP, using a slurry including a chemical action and combining chemical etching, a level surface without damage may be obtained.

Further, in the present invention, there is provided a method of manufacturing a semiconductor device, including the steps of forming a semiconductor element on a semiconductor substrate, then forming an insulating film on the semiconductor element, leveling the top surface of the insulating film, forming a film of the resistor on the top surface of the leveled insulating film, patterning the film of the resistor and forming the resistor on the active region of the insulating film, and forming electrodes to both end portions of the resistor, to thereby achieve the second object. The resistor is formed by, for example, isotropic etching.

Further, in the present invention, there is provided a method of manufacturing a semiconductor device, including the steps of forming a semiconductor element on a semiconductor substrate, forming an insulating film on the semiconductor element, leveling the surface of the insulating film by CMP or the like, forming a film of the resistor on the top surface of the leveled insulating film, forming a protective film to protect the resistor in performing anisotropic etching of electrodes on the film of the resistor, patterning the film of the resistor and the protective film to form a resistor provided thereon with the protective film in an active region of the insulating film, anisotropically etching both end portions of the protective film using, for example, $SiO_2$ (silicon oxide) as a mask for exposure of portions for forming electrodes on both end portions of the resistor, forming the electrodes on both the end portions of the resistor which are exposed from the protective film by anisotropic etching, to thereby achieve the second object. By anisotropic etching of the electrodes, the electrodes may be made compact.

Further, in the present invention, there is provided a method of manufacturing a semiconductor device, including the steps of forming a semiconductor element on a semiconductor substrate, then forming a first insulating film on the semiconductor element, leveling the surface of the first insulating film by CMP or the like, forming a resistor in the active region on the top surface of the leveled insulating film, forming a second insulating film on the resistor, forming contact holes reaching the side surface portions of both end portions of the resistor, in the second insulating film, and forming electrodes in the side surface portions of both the end portions of the resistor through the contact holes, to thereby achieves the second object. In this method, the electrodes may be formed relatively with ease.

Further, in the present invention, there is provided a method of manufacturing a semiconductor device comprising the steps of forming a semiconductor element on a semiconductor substrate, forming a first insulating film on the semiconductor element, leveling the surface of the first insulating film by CMP or the like, forming a film of the resistor on the top surface of the leveled insulating film, forming a film to control the etching speed on the film of the resistor to prevent the contact hole from penetrating the resistor, patterning the resistor and the controlling film which controls the etching speed and forming the resistor provided with the controlling film at the top surface in the active region on the insulating film, forming a second insulating film which is etched faster than the controlling film on the resistor, forming contact holes reaching the top surface portions of both end portions of the resistor in the second insulating film, and forming electrodes at the top surface portions of both end portions of the resistor through the contact holes, to thereby achieve the second object. With this method, when the contact hole formed in the resistor and, for example, a contact hole deeper than the contact hole formed on the electrode below the first insulating film, are simultaneously etched, the penetration of the contact hole through the resistor may be prevented.

Further, in the present invention, there is provided a method of manufacturing a semiconductor device, including the steps of forming a semiconductor element on a semiconductor substrate, then forming a first insulating film on the semiconductor element, leveling the surface of the first insulating film by CMP or the like, forming a resistor on the top surface of the leveled insulating film and in the active region, etching the first insulating film and making the first insulating film thin in regions other than the region where the resistor exists with the resistor as a mask, to form a second insulating film on the resistor, forming contact holes reaching the top surface portions of both end portions of the resistor, on the second insulating film, and forming electrodes at the top surface portions of both end portions of the resistor through the contact holes, to thereby achieve the second object. According to the present invention, the contact holes are prevented from penetrating through the resistor. In places other than the region where the resistor exists, the thickness of the first insulating film is thinned by etching, so that, for example, a contact hole may be formed for the electrode below the first resistor whilst preventing the penetration of the contact hole through the resistor.

Further, in the present invention, there is provided a method of manufacturing a semiconductor device comprising the steps of forming a semiconductor element on a semiconductor substrate, then forming a first insulating film on the semiconductor element, forming a contact hole, for example, reaching the electrode for the wiring of the ladder circuit below the insulating film in the insulating film, forming an electrode below the insulating film through the contact hole, leveling the surface of the insulating film by CMP or the like, forming a resistor in the active region of the top surface of the leveled insulating film so as to connect with the electrode formed in the contact hole, to thereby achieve the second object.

Further, in the present invention, the leveling of the insulating film formed in the active region may be performed by CMP, as well as by etchback and the like.

Further, in the present invention, there is provided a method of manufacturing a semiconductor device in which a temperature when forming the resistor film on the leveled insulating film is set to 450° C. or less, whereby the deformation of the electrode formed below the insulating film may be prevented, thereby achieving the second object.

BRIEF DESCRIPTION OF THE DRAWINGS

In the accompanying drawings:

FIG. 2 is a table of the characteristics of various resistors;

DETAILED DESCRIPTION OF THE PREFERRED EMBODIMENTS

Hereinbelow, preferred embodiments of the present invention are described in derail with reference to FIGS. 1A to 15.

Embodiment 1

Figure 1A:
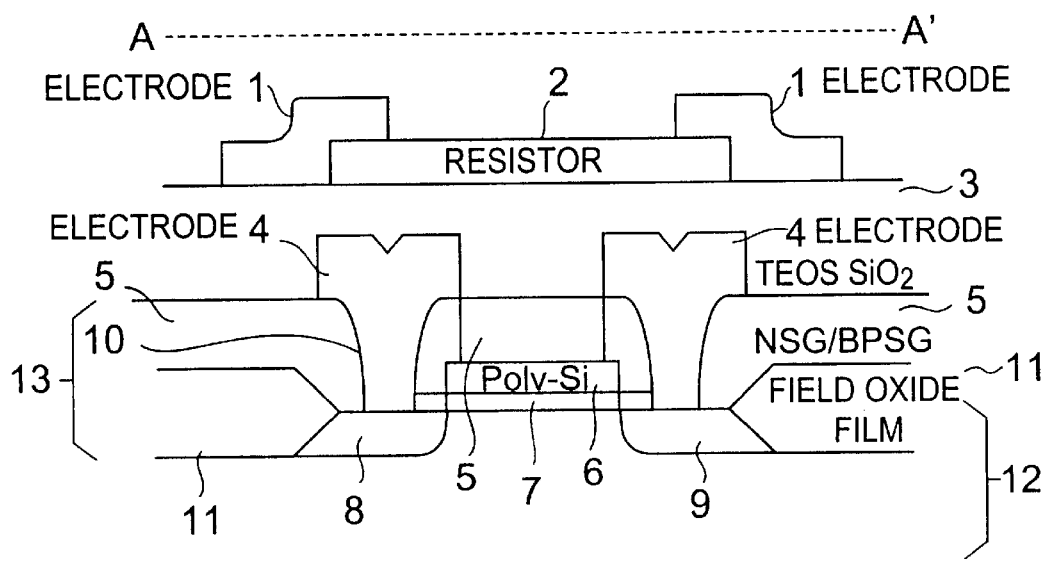
FIGS. 1A and 1B are cross sectional views of a semiconductor device according to Embodiment 1 of the present invention.

FIG. 1A is a cross sectional view of a semiconductor device according to an embodiment of the present invention. The semiconductor device of this embodiment is constituted of a semiconductor substrate 12, a semiconductor element 13 formed thereon, and a resistor 2 which is formed on an active region through an insulating film 3 which has been leveled on the top surface. The active region refers to the region where a semiconductor element is formed on a semiconductor substrate. The region between the respective semiconductor elements is called a field region, and separates the respective elements electrically and physically.

The semiconductor element 13 shown in FIG. 1A is an insulating gate field effect transistor, and is formed of high concentration diffusion layers 8 and 9 referred to as a source and a drain formed on the upper layer portion of the semiconductor substrate 12, a gate oxide film 7 formed on the top surface of the semiconductor substrate 12, and a gate electrode 6 formed on the top surface of the gate oxide film 7. Note that, this does not limit the semiconductor element 13 to the insulating gate field effect transistor, and any other semiconductor element may be used.

The gate electrode 6 is formed of polycrystalline silicon, but may be formed of other resistors or conductors. In this embodiment, the semiconductor substrate 12 is an n-type semiconductor, but may be a p-type semiconductor. Further, the semiconductor substrate 12 may be a well formed in a portion of the semiconductor substrate. On the top surface of the semiconductor substrate 12 in the vicinity of the insulating gate field effect transistor is formed a field oxide film 11 for electrically separating from other elements.

A two layered interlayer insulating film 5 formed of NSG (non doped silicate glass) and BPSG (borophosphosilicate glass) is formed on the field oxide film 11, also covering the gate electrode 6. The interlayer insulating film 5 may be a two-layer formed of NSG and BPSG, as well as one layer formed of NSG, PSG (phophosilicate glass) or BPSG.

The interlayer insulating film 5 is formed with contact holes 10 formed over the high concentration diffusion layers 8 and 9 called the drain and the source. Further, although not shown, the contact hole is also formed over the gate 6. Through these contact holes 10, the high concentration diffusion layers 8 and 9 and the gate 6 are formed with first electrodes 4 formed from metal such as Al—Si (an alloy of aluminum and silicon).

The interlayer insulating film 5 is formed thereon with the insulating film 3 which is leveled on the top surface. The material of the insulating film 3 is TEOS $SiO_2$ with a thickness of from 5000 Å to 13000 Å. Note that, the material of the insulating film 3 is not limited to TEOS $SiO_2$, and may be any other appropriate material.

The top surface of the insulating film 3 on the active region is formed with the resistor 2 formed of polycrystalline silicon. The resistor 2 may be formed from, in addition to polycrystalline silicon, a mixture of Ni and Cr, CrSiO, CrSiN, CrSiON, â-FeSi, amorphous silicon, WSi, TiN, W, TaN, a mixture of Mo and Si, and other substances. Further, the resistor 2 may have a two-layer structure formed of Ti and TiN, or Ti and WN. However, it is preferable that the forming temperature is 450 C. or less so that the shape of the electrode 4 does not deform at the formation of the resistor 2.

Figure 12:
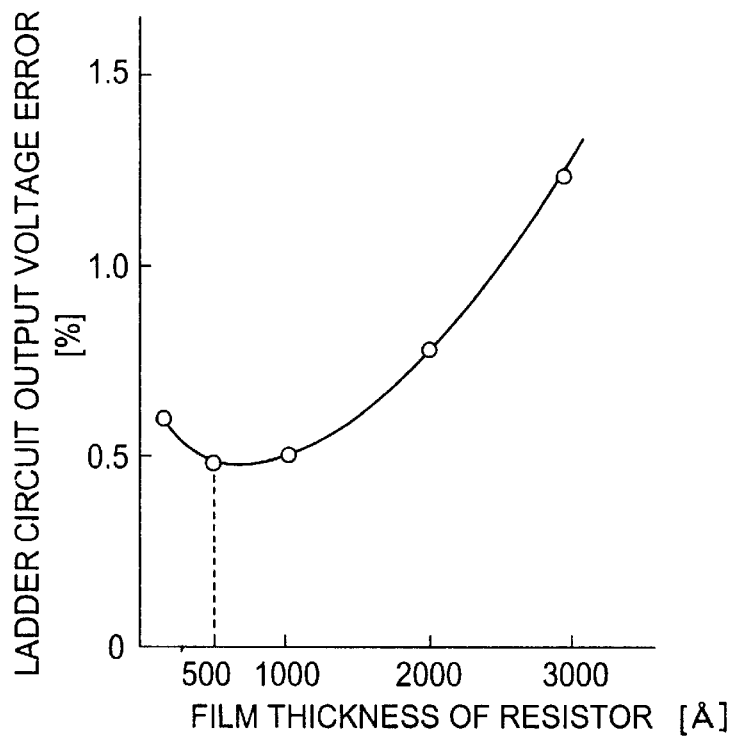
FIG. 12 is a graph showing the relationship between the film thickness of the resistor and a resistor circuit output error of the present invention.

Further, the thickness of the resistor 2 is 500 Å. Note that, it may be formed in the range of 50 Å to 4000 Å, but as shown in the graph of FIG. 12, the film thickness of the resistor 2 is even in the range of 100 Å to 1000 Å, more so in the range of 200 Å to 700 Å. Thus, the specific accuracy increases.

Further, the resistance for the unit length and the unit width, namely the sheet resistance of the resistor 2 is approximately 10 k Ω/□ in this embodiment, but the resistor 2 may be formed in the range of 1 to 1 M Ω/□, more preferably 1 to 50 k Ω/□.

Both side portions of the resistor 2 are formed with electrodes 1. The electrode 1 is formed from an alloy of Al and Si, or the like. Furthermore, the resistor 2 is formed thereon with a passivation film (a protective film formed of an insulator) for protecting a semiconductor chip.

In the embodiment of FIG. 1A, both end portions of the resistor 2 are formed directly with the electrodes 1. However, a semiconductor device provided further with an insulating film on the resistor 2, formed with electrodes of the resistor 2 through contact holes provided in the insulating film may be included in this embodiment.

Figure 1B:
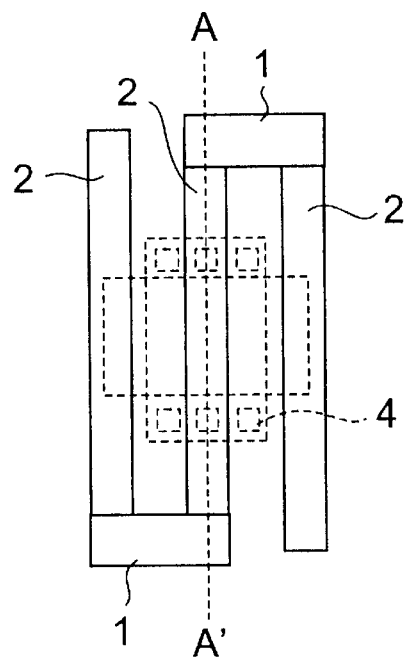

FIG. 1B is a view showing the semiconductor device according to FIG. 1A from the top. FIG. 1A is a cross sectional view of a cross section along the line A–A' of FIG. 1B from the left side of FIG. 1B.

The top surface of the insulating film 3 containing the active region is formed with a plurality of rectangular shaped unit resistors 2 in parallel. The respective resistors 2 are electrically connected at the end portions of the adjacent resistors 2 in two by a second electrode 1, and as a whole, a bent structure is made. The current flows in the longitudinal direction of the resistor 2, and since the resistor 2 has a bent structure, a large resistance may be obtained with a small setting area. That is, the resistors are integrated. In this embodiment, each of the resistors 2 is connected by the second electrode 2, but instead of connecting by the second electrode 1, the resistor 2 may be formed as one object. Further, in FIG. 1B, the second electrode 1 is only connected to the resistor 2, but in order to form the ladder circuit, a structure where the second electrode 1 connects to other element such as the transistor formed on the semiconductor substrate, or the resistor formed above or below the insulating film formed on the active region, may be used.

Figure 13:
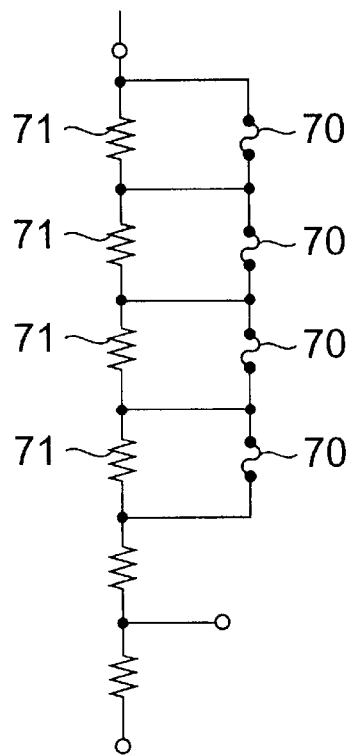
FIG. 13 shows an example of a ladder circuit.
Figure 16:
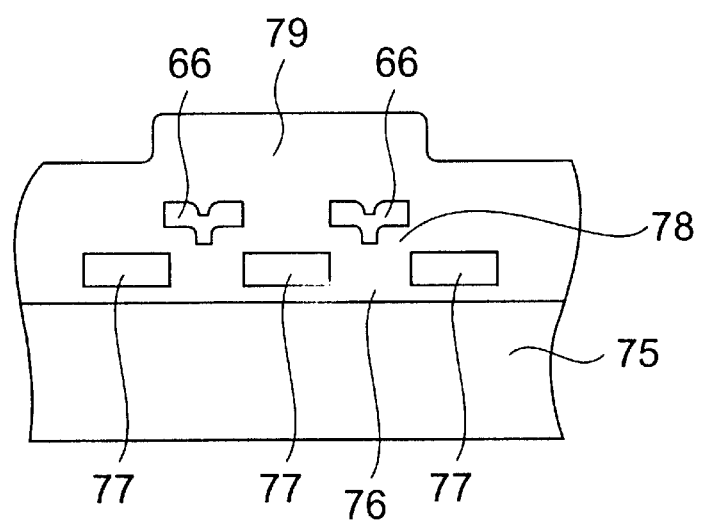
FIG. 16 is a cross sectional view of a portion where the resistor is formed into two layers in a conventional field region.

The ladder circuit referred to here is a circuit for dividing the voltage which controls the voltage of the semiconductor device, and as shown in FIG. 13, has a structure where a fuse 70 and a resistor 71 connected in parallel are connected in serious in a plural manner. The fuse 70 maybe cut by a cutting means such as a laser, to selectively obtain a desired resistance between terminals of the ladder circuit. By connecting the ladder circuit in series to a load, the voltage to be applied to the load may be controlled.

Below the resistor 2, an insulating gate field effect transistor shown by a wave line is formed through the insulating film 3 and the interlayer insulating film 5.

Embodiment 2

FIG. 3 shows an embodiment of a method of manufacturing a semiconductor according to the present invention.

Figure 3A:
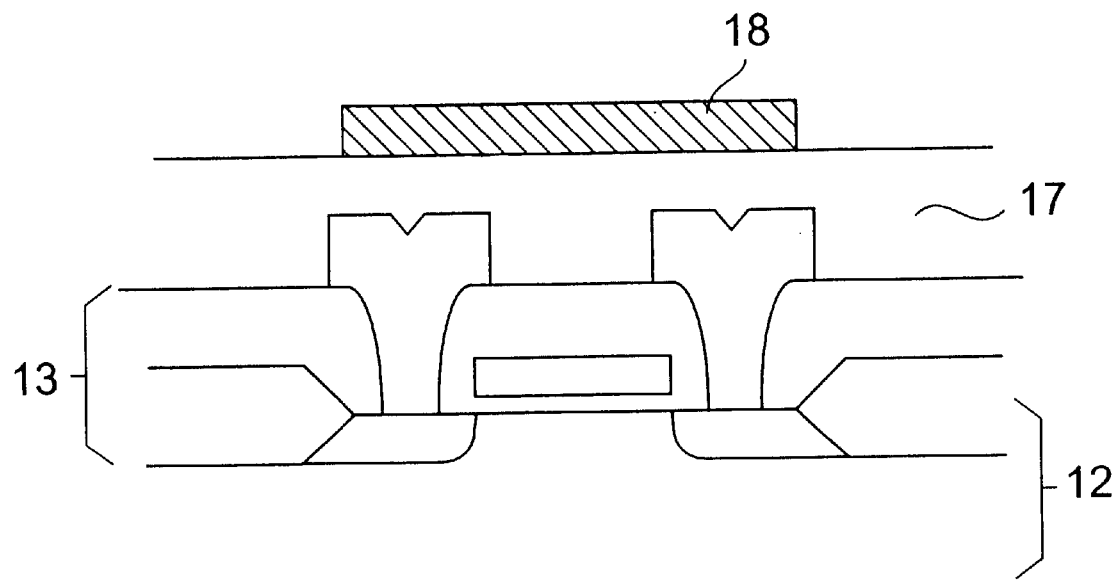
FIGS. 3A and 3B are cross sectional views of steps of a method of manufacturing a semiconductor according to Embodiment 2 of the present invention.

FIG. 3A shows a state where a resistor 18 is formed on the semiconductor element 13 through an insulating film 17 which has a leveled top surface.

A method of manufacturing the semiconductor element 13 is based on various types of known methods, and therefore, it is omitted hereafter.

On the semiconductor substrate 12 formed with the semiconductor element 13, is formed the insulating film 17 made of TEOS $SiO_2$. Next, the top surface of the insulating film 17 is leveled by CMP (chemical mechanical polishing). After the leveling, the thickness of the insulating film 17 is 4000 to 13000 Å. Here, the insulating film 17 is leveled in order to increase the accuracy of the resistance when the resistor 18 is formed on the insulating film 17 later on. When the resistor 18 is formed with an unevenness on the surface, there is a variation in the shape of the resistor depending on places, and the sheet resistance which is a resistance for the unit area differs in places. Thus, a high accuracy resistance can not be realized.

Next, a resistor film for patterning the resistor 18 on the top surface of the insulating film 17 which has been leveled is formed with a thickness of 50 to 4000 Å. As a material of the resistor, a mixture of Ni and Cr, CrSiO, CrSiN, CrSiON, â-FeSi, amorphous silicon, polycrystalline silicon, WSi, TiN, W, TaN, a mixture of Mo and Si, and a two layer of Ti and TiN, a two layer of Ti and WN, or the like is used.

The respective resistors have the features shown in the table of FIG. 2. Namely, the mixture of Ni and Cr has a satisfactory temperature characteristic, and is generally used as a material for a thin film resistor. CrSiO, CrSiN, and CrSiON have a relatively high resistivity among silicide films, and has a satisfactory temperature characteristic. (a)-FeSi also has a relatively high resistivity among the silicide films, and has a low load in respect to the environment. The amorphous silicon and the polycrystalline silicon easily realize the resistance of about several $\Omega/\square$ to several tens of k $\Omega/\square$, and may be easily processed. WSi, TiN and W have a satisfactory temperature characteristic, and may be easily processed. TaN and Mo—Si have a satisfactory temperature characteristic. A two layer of Ti and TiN, and a two layer of Ti and WN may be stress relaxed and have a satisfactory temperature characteristic.

Note that, the temperature of formation of the resistor film is held to 450° C. or less, so that the shape of an electrode 20 of the transistor is not ruined. Next, the resistor 18 is obtained by patterning the resistor film by anisotropic etching.

Figure 3B:
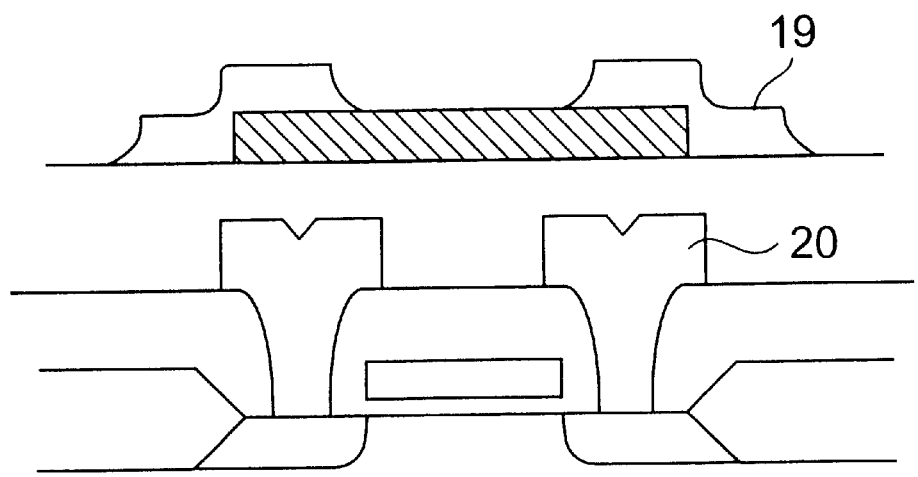

FIG. 3B shows the formation of electrodes on both ends of the resistor 18.

A metal layer is formed on the substrate where the resistor 18 is obtained, and the second electrode 19 is patterned by isotropic etching, to obtain the semiconductor device shown in FIG. 2B. With this method of manufacturing the semiconductor device, a resistor and a contact may be formed with relatively simple steps.

Embodiment 3

Figure 4A:
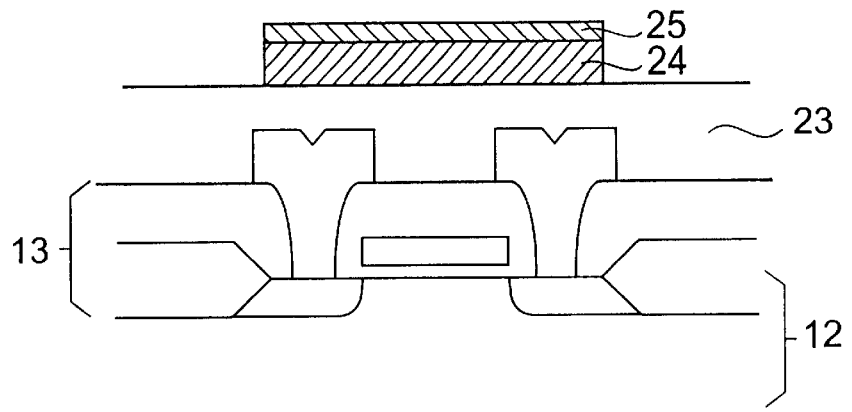
FIGS. 4A to 4D are cross sectional views of steps of a method of manufacturing a semiconductor according to Embodiment 3 of the present invention.
Figure 4B:
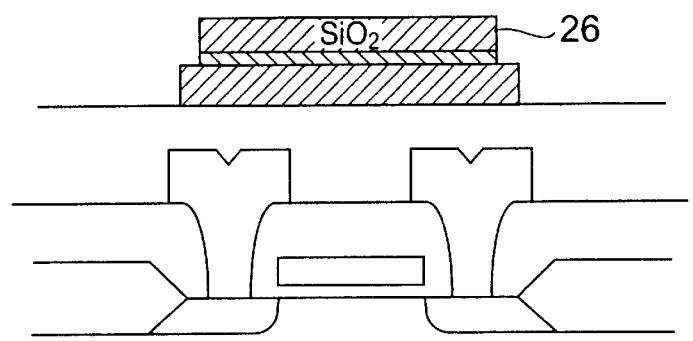
Figure 4C:
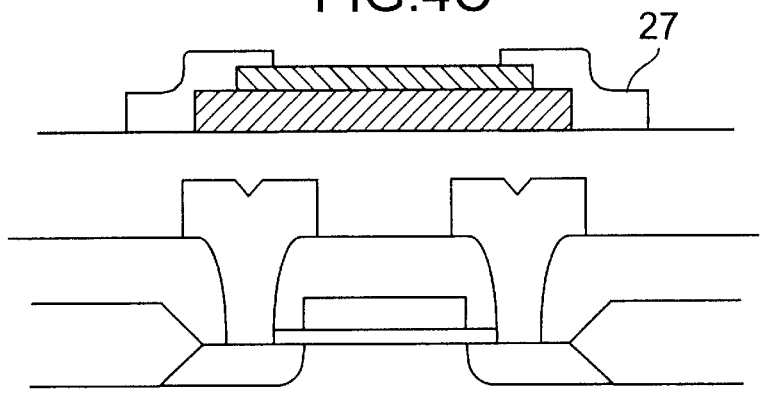

Next, a method of manufacturing the semiconductor device shown in FIGS. 4A and 4B is described.

FIG. 4A shows a state where a resistor 24 provided thereon with an SiN film 25 is formed on the active region.

After forming an insulating film 23 on the semiconductor substrate 12 formed with the semiconductor element 13, the top surface of the insulating film 23 is leveled by CMP, and a resistor film for patterning the resistor 24 on the surface thereof is formed. The thickness and material of the insulating film 23, the thickness, material and temperature of formation of the resistor film are the same as the insulating film 17 and the resistor 18 of Embodiment 2.

Next, an SiN film is formed on the top surface of the film of the transistor. The purpose for forming the SiN film is to cover and protect the resistor 24 when a second electrode 27 is anisotropically etched later on.

Next, the resistor film and the SiN film are anisotropically etched and patterned, to obtain the structure with the SiN film 25 on the resistor 24 shown in FIG. 4A. An $SiO_2$ film 26 is formed thereon, and patterning is performed to expose both ends of the SiN film 25.

Next, with the patterned $SiO_2$ film 25 as a mask, the SiN film 25 on the top surface of both ends of the resistor 24 is removed by anisotropic etching, to obtain the structure of FIG. 4B. Next, after the $SiO_2$ film 25 is removed, a metal layer is formed on the substrate, and this is anisotropically etched to pattern the electrode 27, thereby obtaining the semiconductor device shown in FIG. 4C.

Figure 4D:
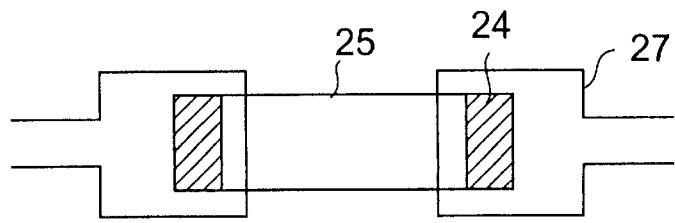

The method of manufacturing the semiconductor device according to this embodiment, has increases of steps in number as compared to the method of manufacturing the semiconductor device according to Embodiment 2. However, by anisotropic etching of the second electrode 27 for an electric connection, as shown in FIG. 4D, the area occupied by the resistor 24 and the electrode 21 on the semiconductor substrate may be made small.

Embodiment 4

Figure 5A:
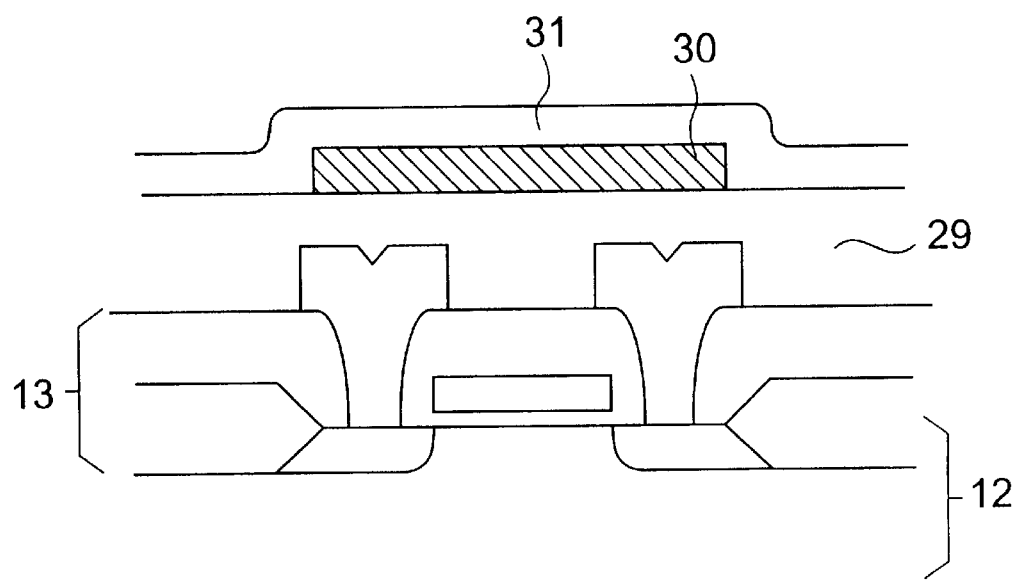
FIGS. 5A and 5B are cross sectional views of steps of a method of manufacturing a semiconductor according to Embodiment 4 of the present invention.
Figure 5B:
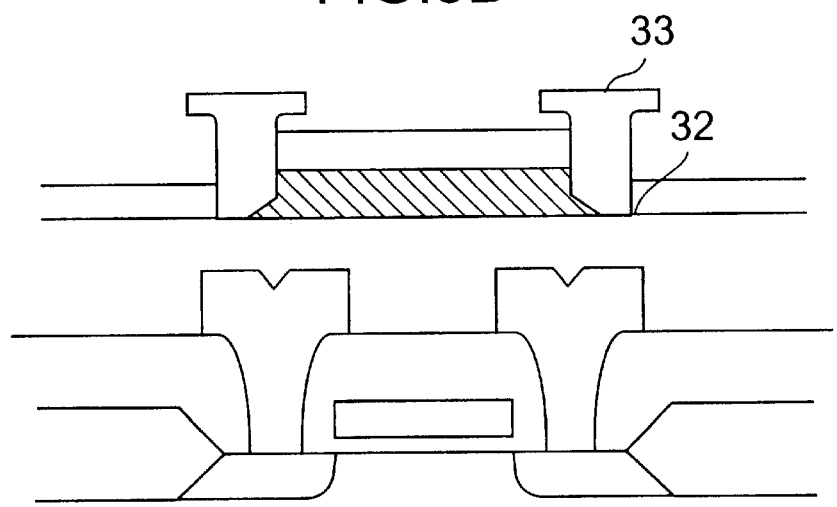

A method of manufacturing the semiconductor device shown in FIGS. 5A and 5B is described.

The structure shown in FIG. 5A is obtained by the below procedures. After forming an insulating film 29 on the semiconductor substrate 12 formed with the semiconductor element 13, the top surface of the insulating film 29 is leveled by CMP. Then, a resistor film for patterning the resistor 30 on the leveled surface of the insulating film 29 is formed. The thickness and material of the insulating film 29, and the thickness, material and formation temperature of the resistor film are the same as the insulating film 17 and the resistor 18 of Embodiment 2.

Next, a resistor 30 is patterned by anisotropically etching the resistor film.

Next, an $SiO_2$ film 31 is formed on the insulating film 29 and the resistor 30.

The semiconductor device shown in FIG. 5B is obtained by carrying out the below procedures sequentially. Contact holes 32 are formed by anisotropic etching at the side surface of both end portions of the resistor 30. Next, second electrodes 33 are formed in the resistor 30 through the contact holes 32. By the method of manufacturing the semiconductor device according to this embodiment, the resistor 30 may be contacted by a relatively simple step.

Embodiment 5

Next, a method of manufacturing the semiconductor device shown in FIG. 6 is described.

Figure 6A:
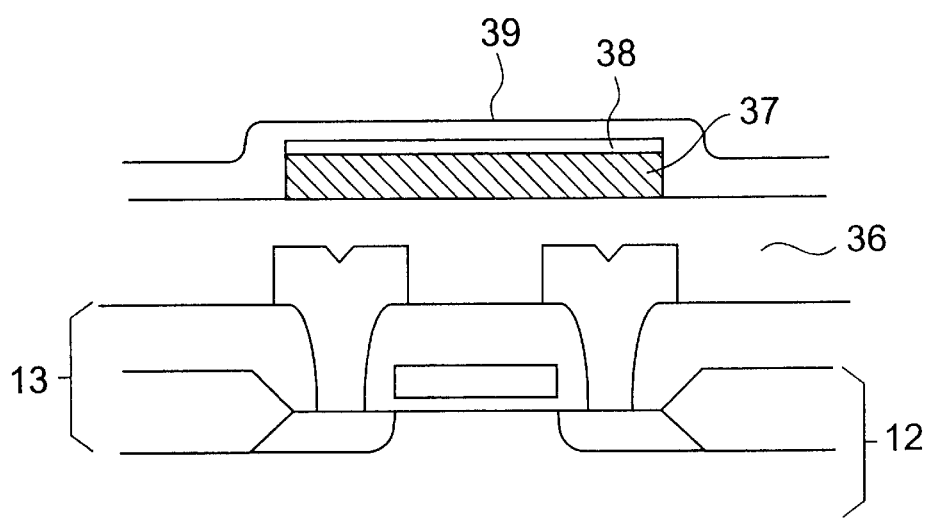
FIGS. 6A and 6B are cross sectional views of steps of a method of manufacturing a semiconductor according to Embodiment 5 of the present invention.

The structure as shown in FIG. 6A is obtained by the following procedures. After forming an insulating film 36 on the semiconductor substrate 12 formed with the semiconductor element 13, the top surface of the insulating film 36 is leveled by CMP, and the resistor film is formed on the surface thereof to pattern a resistor 37. The thickness and material of the insulating film 36, and the thickness, material and formation temperature of the resistor film are the same as the insulating film 17 and the resistor 18 of Embodiment 2.

Next, an SiN film is formed on the film of the resistor. Then, the film of the resistor and the SiN film are patterned by anisotropic etching, to obtain a structure provided with an SiN film 38 on the resistor 37. The purpose for forming the SiN film 38 is to control the etching speed when forming the contact hole as described later, and to prevent a contact hole 40 from penetrating through the resistor 37.

Next, an $SiO_2$ film 39 is formed on the insulating film 36 and the SiN film 38.

Figure 6B:
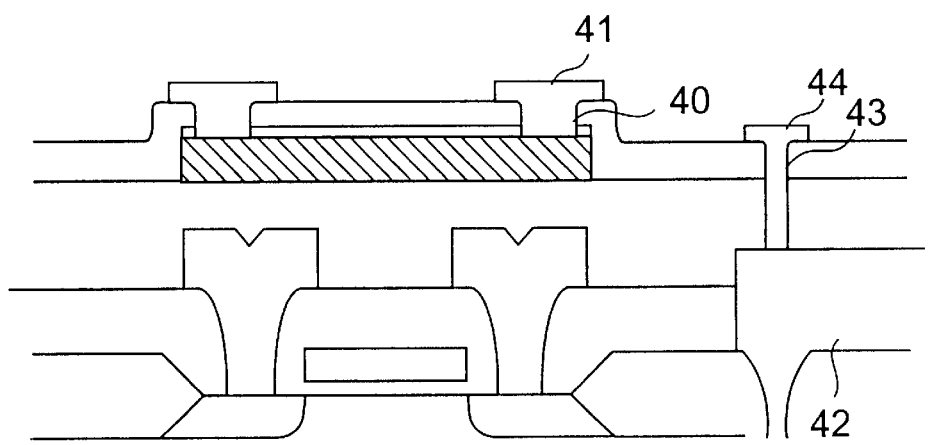

The semiconductor device as shown in FIG. 6B is obtained by the following procedures. The contact hole 40 is formed by anisotropic etching on the top surface of both ends of the resistor 37. At this time, the contact hole 40, and a contact hole 43 for connecting with a first electrode 42 below the insulating film 36 are formed simultaneously. Namely the contact hole 40 with a shallow depth, and another contact hole 43 with a deep depth are etched simultaneously. Therefore, by forming the SiN film 38 with a slower etching speed than the $SiO_2$ film on the top surface of the resistor 37, the etching speed is controlled and the contact hole is prevented from penetrating through the resistor 37.

Next, a second electrode 41 is formed on the resistor 37 through the contact hole 40. At that time, a first electrode 44 is also formed.

In the method of manufacturing the semiconductor device according to Embodiment 4, the difference in size or depth of the contact hole 27 may influence the resistance, but in the method of manufacturing the semiconductor device according to this embodiment, a resistor with a stable and accurate resistance may be obtained.

Embodiment 6

Next, a method of manufacturing the semiconductor device shown in FIG. 7 is described.

Figure 7A:
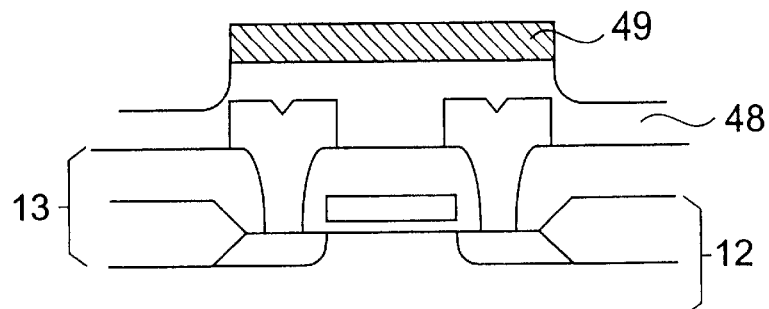
FIGS. 7A and 7B are cross sectional views of steps of a method of manufacturing a semiconductor according to Embodiment 6 of the present invention.

The structure as shown in FIG. 7A is obtained by the following procedures. After forming an insulating film 48 on the semiconductor substrate 12 formed with the semiconductor element 13, the top surface of the insulating film 48 is leveled by CMP, and the resistor film is formed on the surface thereof to form a resistor 49. The thickness and material of the insulating film 48, and the thickness, material and formation temperature of the resistor film are the same as the insulating film 17 and the resistor 18 of Embodiment 2.

Next, the resistor 49 is patterned by anisotropic etching of the film of the resistor.

Then, the insulating film 48 is isotropically etched with the resistor 49 as a mask, to make the thickness of the insulating film 48 thin in regions other than the region where the resistor 49 is formed. In this way, the structure of FIG. 7A where the insulating film 48 is thick under the resistor 49, and the insulating film 48 is thin in other regions is obtained.

Figure 7B:
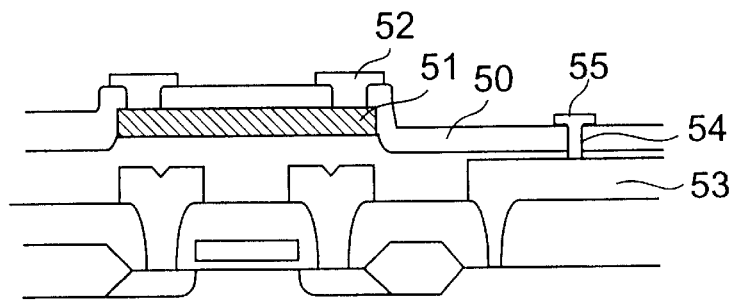

Subsequently, the following procedures are performed to obtain the semiconductor device shown in FIG. 7B. An $SiO_2$ film 50 is formed on the entire substrate formed with insulating film 48 and the resistor 49.

Next, a contact hole 51 is formed by anisotropic etching. At this time, since the insulating film 48 is thinned in regions other than the resistor 49, the contact hole 51 may be anisotropically etched at the same time as a contact hole 54 for forming a second electrode 55 which connects with a first electrode 53 below the insulating film 48. Thus, the contact hole 51 does not penetrate the resistor 49.

Next, a second electrode 52 of the resistor 49 is formed through the contact hole 51.

In the method of manufacturing the semiconductor device according to this embodiment, the penetration of the contact hole 51 through the resistor 49 by a simple step may be prevented.

Embodiment 7

Next, a method of manufacturing the semiconductor device shown in FIG. 8 is described.

In this embodiment, opposite to the methods of manufacturing described above, first an electrode 60 is formed, and thereafter a resistor 61 is formed.

Figure 8A:
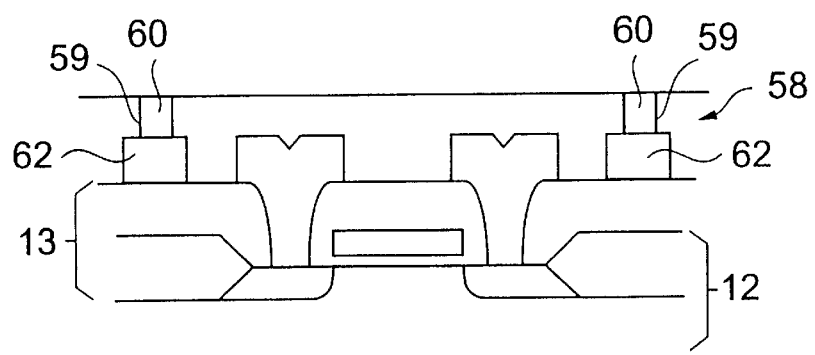
FIGS. 8A and 8B are cross sectional views of steps of a method of manufacturing a semiconductor according to Embodiment 7 of the present invention.

The structure as shown in FIG. 8A is obtained by the following procedures. After forming an insulating film 58 on the semiconductor substrate 12 formed with the semiconductor element 13, the top surface of the insulating film 58 is leveled by CMP. Then, a contact hole 59 is formed to a first electrode 62 below the insulating film by anisotropic etching.

Next a first electrode 60 of the resistor 61 is formed inside the contact hole 59.

Then, the top surface of the insulating film 58 is leveled again by CMP. The material of the insulating film 58 and the thickness thereof after the leveling are the same as the insulating film 17 of Embodiment 2.

Figure 8B:
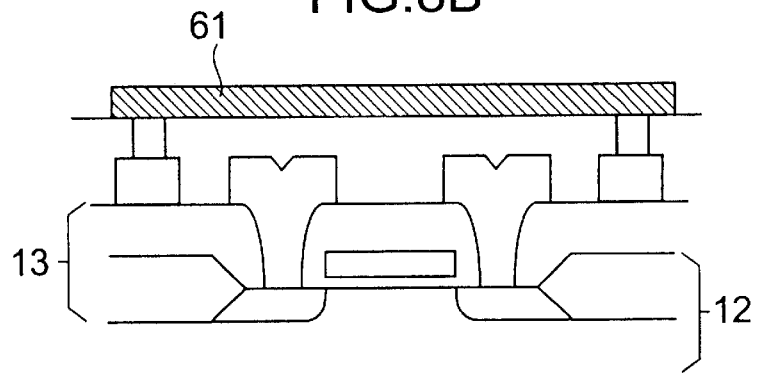

Subsequently, the following procedures are performed to obtain the semiconductor device shown in FIG. 8B. The resistor film for forming the resistor 61 on the leveled insulating film 58 is formed, and thereafter it is anisotropically etched to connect to the first electrode 60 and the resistor 61 is patterned.

The thickness, the material and the formation temperature of the resistor film are the same as the resistor 18 of Embodiment 2.

In the method of manufacturing the semiconductor device according to this embodiment, stress is hardly generated with the resistor 61, and the resistor 61 with a high accurate resistance may be obtained.

In Embodiments 2 to 7, the insulating film formed on the semiconductor substrate formed with the semiconductor element is leveled by CMP, but the insulating film may be formed by SOG (spin on glass) and leveled by etchback.

Figure 9:
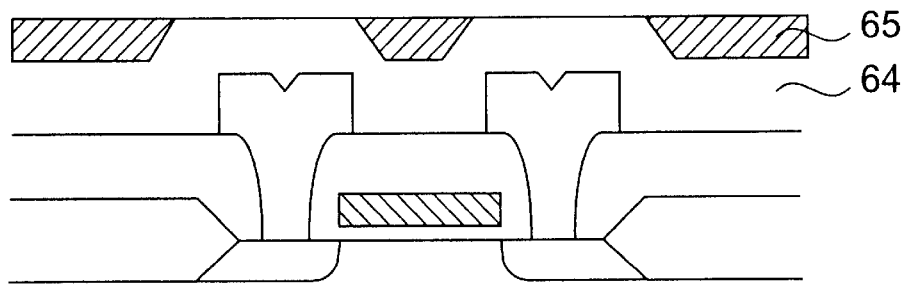
FIG. 9 is a cross sectional view of an insulating film formed on the active region that is leveled by etchback.

FIG. 9 is a cross sectional view of an insulating film formed on the semiconductor substrate formed with the semiconductor element, which is formed by etchback.

A resist 65 is formed on an insulating film 64 formed in the active region, and this is etchbacked to form a level region on the active region. By this method, the insulating film 64 is leveled, and thereafter the resistor may be formed on the active region.

Figure 10:
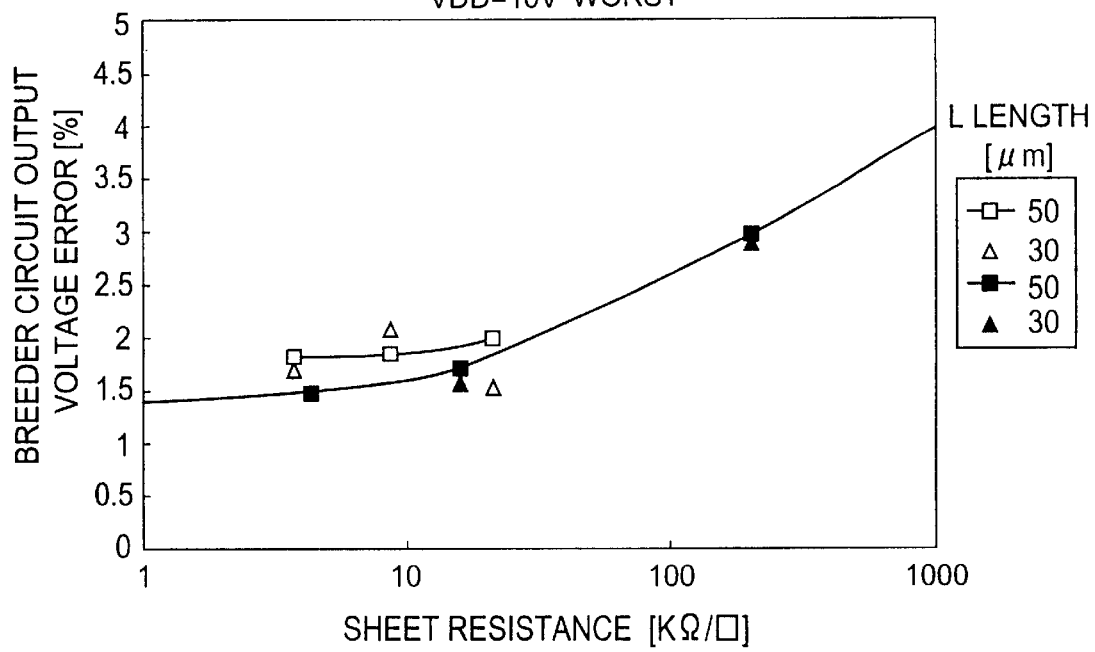
FIG. 10 is a graph of a specific accuracy of a ladder circuit output voltage in respect to a sheet resistance of a resistor of the present invention.

FIG. 10 is a table comparing the specific accuracy of the ladder circuit output voltage, in respect to the sheet resistance of the resistor.

The white triangular symbol in the figure shows the first sample data with L=30 μm (L is a width of a resistor), the white square symbol shows the first sample data with L=50 μm, and the black triangular symbol shows the second sample data with L=30 μm, and the black square symbol shows the second sample data with L=50 μm.

As can be seen in the table of FIG. 10, if the resistance is 10 kÙ or less, the difference is suppressed to about 1.5%, whereas when the resistance is 10 kÙ or more, the difference increases rapidly as the resistance increases. Accordingly, it is preferable that the resistor is formed with a sheet resistance in the range of 1 to 50 k Ω.

Figure 11:
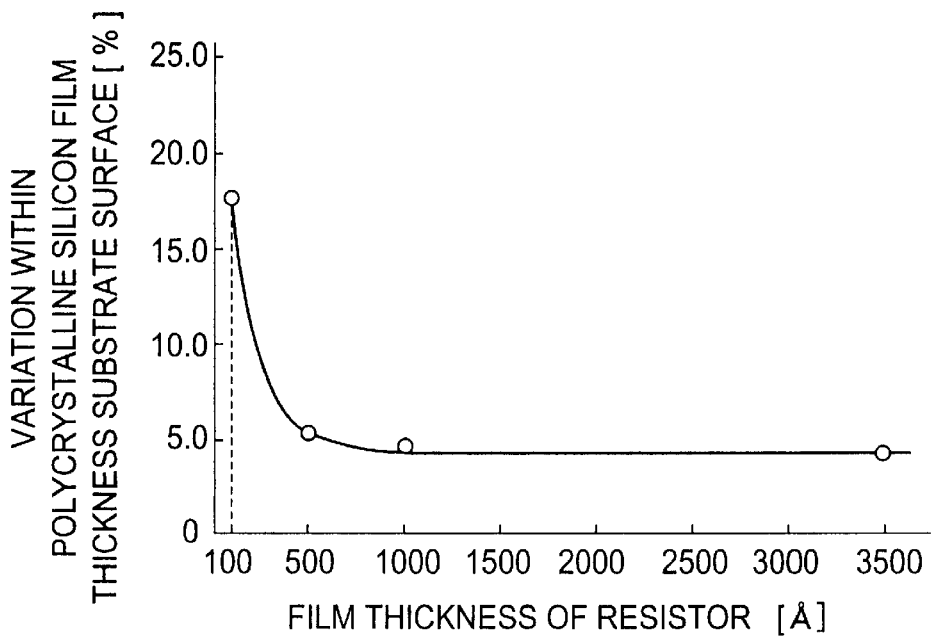
FIG. 11 is a graph showing variation of the thickness of the resistor with in the substrate surface when the resistor of the present invention is formed.

FIG. 11 shows the variation in film thickness of the resistor within the substrate surface by comparison of the thicknesses of the film. As can be seen from the figure, the variation of the film thickness may be kept at 5% or less when the film thickness is 500 Å or more, but with a thickness of 500 Å or less, the variation of the film thickness rapidly increases with the decrease of the film thickness. Accordingly, when the resistor is formed, it is preferable that the film thickness is 500 Å or more.

FIG. 12 shows the comparison of output voltage errors of the ladder circuit due to the variation of the resistance when the film thickness of the resistor when a sheet resistance of 9 k Ω is changed. As can be seen from the graph, even with resistors having the same electrical performance, up to 500 Å in film thickness, as the film thickness becomes thinner, the error decreases, and when the film thickness becomes 500 Å or less, the error increases. As described above, this arises from the increase of film thickness variation when the film thickness becomes 500 Å or less. From the experimental results of FIGS. 11 and 12, it is understood that the film thickness is most preferably 500 Å.

Figure 14:
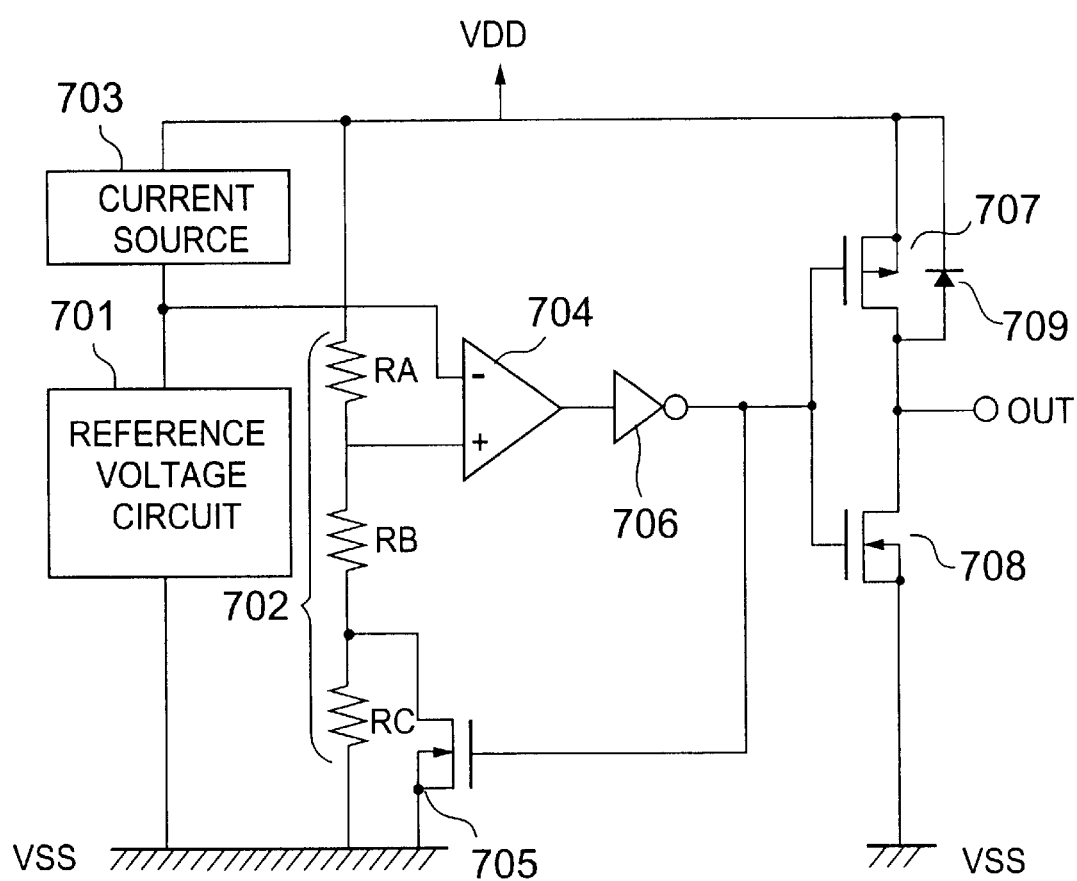
FIG. 14 is a block diagram of an embodiment of a voltage detector using a bleeder resistance circuit according to the present invention.

FIG. 14 is a block diagram of an embodiment of a voltage detector using a bleeder resistance circuit according to the present invention.

For simplicity, an example of a simple circuit was shown, but functions may be added to actual products when necessary.

The basic circuit structural components of the voltage detector are a current source 703, a standard voltage circuit 701, a bleeder resistance circuit 702 and an error amplifier 704. Others such as an inverter 706, n-type transistors 705 and 708, and a p-type transistor 707 are added thereto. A part of the operation is simply explained below.

When VDD is a predetermined releasing voltage or more, the n-type transistors 705 and 708 are turned OFF, and the p-type transistor 707 is turned ON, and VDD is output in the output OUT.

At this time, the input voltage of the error amplifier 704 becomes (RB+RC)/(RA+RB+RC) * VDD.

When VDD decreases and becomes the detected voltage or lower, VSS is output in the output OUT. At this time, the n-type transistor 705 is ON and the input voltage of the error amplifier 704 becomes RB/(RA+RB) * VDD.

In this way, the basic operation is performed by comparing the reference voltage generated by the reference voltage circuit 701 and the voltage divided by the breeder resistance circuit 702 at the error amplifier 704. Therefore the accuracy of the voltage divided by the breeder resistance circuit 702 becomes very important. If the voltage accuracy of the breeder resistance circuit 702 is unsatisfactory, the input voltage to the error amplifier 704 varies, and a predetermined release or a detected voltage cannot be obtained. By using the breeder resistance circuit according to the present invention, a high accuracy dividing is possible so that the yield in products as IC may improve or a more accurate voltage detector may be manufactured. Further, in order to suppress the current consumption of the IC, there are many cases where the resistance of the entire breeder resistance circuit 702 is made a high-resistance of megohm order or more. At this time, since an extremely elongated shaped resistor is combined and structured, a large area is necessary in order to maintain a constant accuracy. With a voltage detector, the breeder resistance circuit may occupy half or more of the entire surface of the IC chip. The breeder resistance circuit according to the present invention may be formed on the active region. Accordingly, the occupied area of the breeder resistance circuit may be decreased, which may greatly contribute to the area reduction of the entire IC chip.

Figure 15:
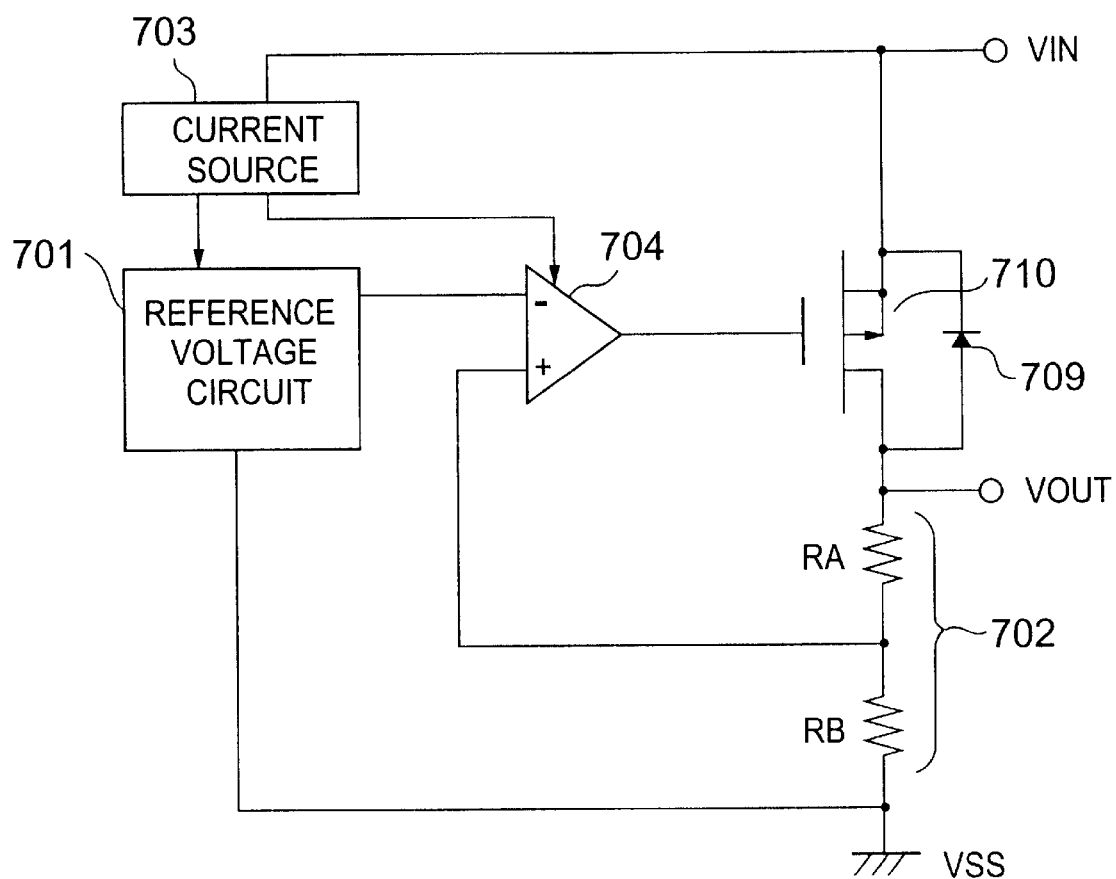
FIG. 15 is a block diagram of an embodiment of a voltage regulator using a bleeder resistance circuit according to the present invention.

FIG. 15 is a block diagram of an embodiment of a voltage regulator using a bleeder resistance circuit.

For simplicity an example of a simple network is shown, but functions may be added to actual products when necessary.

The basic circuit structural components of a voltage regulator are the current source 703, the reference voltage circuit 701, the breeder resistance circuit 702, the error amplifier 704, and a p-type transistor 710 which functions as a current controlling transistor. A part of the operation is simply explained below.

The error amplifier 704 compares the voltage divided by the breeder resistance circuit 702 and the reference voltage generated by the reference voltage circuit 701, and supplies the gate voltage which is necessary to obtain a constant output voltage VOUT which is not influenced by input voltage VIN or temperature change, to the p-type transistor 710. In the voltage regulator similarly to the voltage detector explained in FIG. 14, the basic operation is performed by comparing the reference voltage generated in the reference voltage circuit 701 and the voltage divided in the breeder resistance circuit 702 at the error amplifier 704. Therefore, the accuracy of the voltage divided in the breeder resistance circuit 702 becomes extremely important. If the dividing accuracy of the breeder resistance circuit 702 is unsatisfactory, the input voltage to the error amplifier 704 varies, and a predetermined output voltage VOUT cannot be obtained. By using the breeder resistance circuit according to the present invention, even if a large resistor capable of more accurate dividing is used in the breeder resistance circuit, since the area may be reduced compared with a conventional chip, the yield of the product as an IC may be improved, or a more accurate voltage regulator may be manufactured with a smaller chip area.

According to the present invention, the resistor may be formed on the active region. In this way, integration is performed with the semiconductor device, and there is an effect that the bleeder resistance circuit may be formed with a smaller area than an occupied area by the conventional method.

In the voltage detector and the voltage regulator according to the present invention, since an accurate voltage dividing is possible with a smaller area than a conventional chip area, the product yield as an IC may be improved or a more accurate and cheap product may be manufactured. Further, in order to suppress the current consumption of the IC, the resistance of the entire breeder resistance circuit is often a high-resistance of a megohm order or more. At this time, in order to maintain a constant accuracy, an extremely elongated shaped resistor is combined and structured so that a large area is necessary. With the voltage detector, it is not rare that the breeder resistance circuit occupies half or more of the entire surface of the IC chip. The breeder resistance circuit according to the present invention may be formed on the active region, so that a constant accuracy may be obtained with a short shape. Accordingly, the occupied area of the breeder resistance circuit may be decreased, which may greatly contribute to the area reduction of the entire IC chip.

With the method of manufacturing the semiconductor device according to the present invention, there is an effect that the above semiconductor device may be formed without a special step or a large increase in steps.

What is claimed is:

1. A semiconductor device comprising:
    a semiconductor element formed on a semiconductor substrate and having a gate electrode, a source region and a drain region;
    a first insulating film having a plurality of contact holes;
    a plurality of metal wirings each connected through a respective one of the contact holes to the gate electrode, the source region and the drain region of the semiconductor element;
    a second insulating film formed on the first insulating film and the metal wirings, the second insulating film having a chemical-mechanical polished portion defining a flattened upper surface of the second insulating film; and
    a plurality of resistors formed on and in direct contact with the flattened upper surface of the second insulating film and connected in series to form a bleeder resistor circuit.

2. A semiconductor device according to claim 1; wherein at least some of the resistors are formed in a region where the semiconductor element is formed.

3. A semiconductor device according to claim 1; wherein each of the resistors is made of a substance selected from the group consisting of a mixture of Ni and Cr, CrSiO, CrSiN, CrSiON, â-FeSi, amorphous silicon, polycrystalline silicon, WSi, TIN, W, TaN, and a mixture of Mo and Si.

4. A semiconductor device according to claim 1; wherein each of the resistors has a two layer structure formed of Ti and TIN.

5. A semiconductor device according to claim 1; wherein each of the resistors comprises a film having a thickness in the range of 50 to 4000 Å.

6. A semiconductor device according to claim 1; wherein each of the resistors has a resistivity in the range of 1 to 1 M $\Omega/\square$.

7. A semiconductor device according to claim 1; wherein each of the resistors has a two layer structure formed of Ti and WN.

8. A semiconductor device according to claim 1; wherein each of the resistors comprises a film having a thickness in the range of 100 to 1000 Å.

9. A semiconductor device according to claim 1; wherein each of the resistors comprises a film having a thickness in the range of 200 to 700 Å.

10. A semiconductor device according to claim 1; wherein each of the resistors has a resistivity in the range 1 to 50 K $\Omega/\square$.

11. A semiconductor device comprising:
    a semiconductor element formed on a semiconductor substrate and having a gate electrode, a source region and a drain region;
    a first insulating film having a plurality of contact holes;
    a plurality of metal wirings each connected through a respective one of the contact holes to the gate electrode, the source region and the drain region of the semiconductor element;
    a second insulating film formed on the first insulating film and the metal wirings, the second insulating film having a chemical-mechanical polished portion defining a flattened upper surface of the second insulating film; and
    a plurality of resistors formed on and in direct contact with the flattened upper surface of the second insulating film and connected in series to form a ladder circuit.

12. A semiconductor device according to claim 11; wherein at least some of the resistors are formed in a region where the semiconductor element is formed.

13. A semiconductor device according to claim 11; wherein each of the resistors is made of a substance selected from the group consisting of a mixture of Ni and Cr, CrSiO, CrSiN, CrSiON, â-FeSi, amorphous silicon, polycrystalline silicon, WSi, TiN, W, TaN, and a mixture of Mo and Si.

14. A semiconductor device according to claim 11; wherein each of the resistors has a two layer structure formed of Ti and TIN.

15. A semiconductor device according to claim 11; wherein each of the resistors comprises a film having a thickness in the range of 50 to 4000 Å.

16. A semiconductor device according to claim 11; wherein each of the resistors has a resistivity in the range of 1 to 1 M $\Omega/\square$.

17. A semiconductor device according to claim 11; wherein each of the resistors has a two layer structure formed of Ti and WN.

18. A semiconductor device according to claim 11; wherein each of the resistors comprises a film having a thickness in the range of 100 to 1000 Å.

19. A semiconductor device according to claim 11; wherein each of the resistors comprises a film having a thickness in the range of 200 to 700 Å.

20. A semiconductor device according to claim 11; wherein each of the resistors has a resistivity in the range 1 to 50 K $\Omega/\square$.

21. A semiconductor device comprising:
    a semiconductor element formed on a semiconductor substrate and having a gate electrode, a source region and a drain region;
    a first insulating film having a plurality of contact holes;
    a plurality of metal wirings each connected through a respective one of the contact holes to the gate electrode, the source region and the drain region of the semiconductor element;
    a second insulating film formed on the first insulating film and the metal wirings, the second insulating film having a polished portion defining a flattened upper surface of the second insulating film; and
    a plurality of resistors formed on and in direct contact with the flattened upper surface of the second insulating film.

22. A semiconductor device according to claim 21; wherein the resistors are connected in series to form a bleeder resistor circuit.

23. A semiconductor device according to claim 21; wherein the resistors are connected in series to form a ladder circuit.

24. A semiconductor device according to claim 21; wherein the polished portion comprises a chemical-mechanical polished portion.

* * * * *